(12) United States Patent
Tanaka et al.

(10) Patent No.: US 7,358,156 B2
(45) Date of Patent: Apr. 15, 2008

(54) COMPOUND SEMICONDUCTOR DEVICE AND METHOD OF MANUFACTURING THE SAME

(75) Inventors: Akira Tanaka, Kanagawa-ken (JP); Masaaki Onomura, Tokyo (JP); Seiji Iida, Kanagawa-ken (JP); Takayuki Matsuyama, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/376,547

(22) Filed: Mar. 16, 2006

(65) Prior Publication Data

US 2007/0093041 A1 Apr. 26, 2007

(30) Foreign Application Priority Data

Oct. 6, 2005 (JP) .............................. 2005-293840

(51) Int. Cl.
*H01L 21/00* (2006.01)
(52) U.S. Cl. ..................... 438/462; 438/463; 438/33; 257/E21.238
(58) Field of Classification Search ................ 438/718, 438/736, 462, 33, 42, 43, 46, 460, 463; 257/79, 257/594, E21.238
See application file for complete search history.

(56) References Cited

U.S. PATENT DOCUMENTS 5,269,233 A * 12/1993 Johnson et al. ............. 110/110

| 6,518,079 | B2 * | 2/2003 | Imler ............................ 438/33 |
| 6,737,678 | B2 | 5/2004 | Kawakami |
| 7,041,523 | B2 * | 5/2006 | Kawakami et al. ............ 438/33 |
| 7,064,046 | B2 * | 6/2006 | Wakui et al. ................. 438/458 |
| 7,064,047 | B2 * | 6/2006 | Fukasawa et al. ............ 438/460 |
| 2005/0093009 | A1 | 5/2005 | Kuramoto |
| 2005/0181527 | A1 * | 8/2005 | Ohno et al. .................... 438/33 |
| 2005/0287768 | A1 * | 12/2005 | Owens ......................... 438/460 |

FOREIGN PATENT DOCUMENTS

| JP | 2003-017790 | 1/2003 |
| JP | 2003-218065 | 7/2003 |
| JP | 2004-165227 | 6/2004 |

* cited by examiner

*Primary Examiner*—Minsun Oh Harvey
*Assistant Examiner*—Joshua J King
(74) *Attorney, Agent, or Firm*—Banner & Witcoff, Ltd

(57) ABSTRACT

A method of manufacturing a compound semiconductor device comprises forming a scribed groove extending from an edge of a major surface of a laminated body to an internal region on the first major surface. The laminated body has the first major surface and a second major surface and is formed by crystal growth of a compound semiconductor multilayer film on a substrate. The scribed groove is shallow at the edge and deep in the internal region. The method may further comprise separating the laminated body into first and second portions separated by a separation plane including the scribed groove by applying load to the second major surface of the laminated body.

20 Claims, 19 Drawing Sheets

COMPOUND SEMICONDUCTOR DEVICE AND METHOD OF MANUFACTURING THE SAME

CROSS-REFERENCE TO RELATED APPLICATIONS

This application is based upon and claims the benefits of priorities from the prior Japanese Patent Application No. 2005-293840, filed on Oct. 6, 2005; the entire contents of which are incorporated herein by reference.

BACKGROUND OF THE INVENTION

1. Field of the Invention

This invention relates to a compound semiconductor device and a method of manufacturing the same, and more particularly to the compound semiconductor device formed by separating a laminated body of a compound semiconductor multilayer film and a substrate, and the method of manufacturing the same.

2. Background Art

A nitride semiconductor, which is one compound semiconductor, is promising to be increasingly used not only in blue light emitting semiconductor devices but also in high frequency devices and high power switching devices in view of its wide band gap and its electron saturation velocity being greater than that of GaAs.

SUMMARY OF THE INVENTION

According to an aspect of the invention, there is provided a method of manufacturing a compound semiconductor device comprising forming a scribed groove extending from an edge of a major surface of a laminated body to an internal region on the first major surface, the laminated body having the first major surface and a second major surface and being formed by crystal growth of a compound semiconductor multilayer film on a substrate, and the scribed groove being shallow at the edge and deep in the internal region.

According to another aspect of the invention, there is provided a method of manufacturing a compound semiconductor device comprising: forming a scribed groove extending from an edge of a major surface of a laminated body to an internal region on the first major surface, the laminated body having the first major surface and a second major surface and being formed by crystal growth of a compound semiconductor multilayer film on a substrate, and the scribed groove being shallow at the edge and deep in the internal region; and separating the laminated body into first and second portions separated by a separation plane including the scribed groove by applying load to the second major surface of the laminated body.

According to another aspect of the invention, there is provided a method of manufacturing a compound semiconductor device comprising: forming a first scribed groove extending from an edge of a first major surface of a laminated body to an internal region on the first major surface, the laminated body having the first major surface and a second major surface and being formed by crystal growth of a compound semiconductor multilayer film on a substrate, the first scribed groove being shallow at the edge and deep in the internal region; forming a bar separated by a first separation plane including the first scribed groove by applying load to the second major surface of the laminated body; forming a second scribed groove extending from an edge of one of the first and second major surfaces of the bar to an internal region by irradiating the one major surface with laser light, the second scribed groove being shallow at the edge and deep in the internal region; and forming a compound semiconductor device separated by a second separation plane including the second scribed groove by applying load to the other of the first and second major surfaces of the bar.

DETAILED DESCRIPTION OF THE INVENTION

Figure 1:
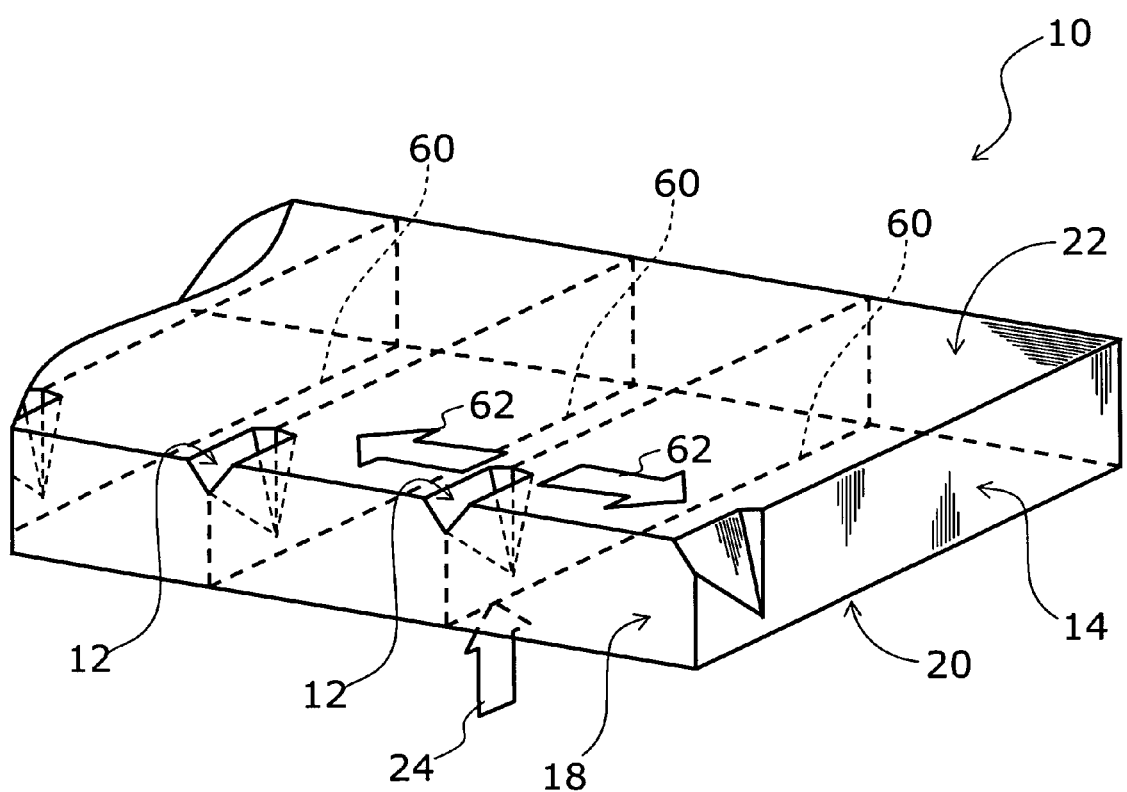
FIG. 1 is a schematic perspective view illustrating the relevant part of a method of manufacturing a nitride semiconductor device according to an example of the invention.

Embodiments of the invention will now be described with reference to the drawings. It should be noted that throughout the figures, like or corresponding elements are marked with the same reference numerals and duplicated description will be omitted.

FIG. 1 is a schematic perspective view for illustrating a method of manufacturing a nitride semiconductor device according to an example of the invention. In particular, this figure is a schematic perspective view for illustrating the relevant part of a manufacturing method of separating semiconductor devices from a bar 10 made of a laminated body of a semiconductor multilayer film and a substrate.

The description herein will be made by taking an example of a gallium nitride semiconductor multilayer film represented by $In_xGa_yAl_{1-x-y}N$ ($0 \leq x \leq 1$, $0 \leq y \leq 1$, $x+y \leq 1$) formed on a GaN substrate.

First, a gallium nitride semiconductor multilayer film represented by $In_xGa_yAl_{1-x-y}N$ ($0 \leq x \leq 1$, $0 \leq y \leq 1$, $x+y \leq 1$) is formed on a GaN substrate using MOCVD (Metal Organic Chemical Vapor Deposition), for example. The laminated body of the GaN substrate and the semiconductor multilayer film is polished to a thickness of 80 to 150 micrometers and then an electrode is formed thereon.

Note that the side being in contact with the electrode may be an N (nitrogen) surface of the GaN substrate, which is referred to as a first major surface 22 of the laminated body including the semiconductor multilayer film. As described above, FIG. 1 shows a process of separating semiconductor devices (or chips) from the bar 10 cleaved from the laminated body including the semiconductor multilayer film. A process of producing the bar 10 will be described later.

The first major surface 22, which is an N (nitrogen) surface side of gallium nitride material, is scanned with YAG laser to form laser scribed grooves 12 at predetermined positions on the bar 10. In the case where the semiconductor device has a semiconductor multilayer film formed on a SiC substrate or on a sapphire substrate, the first major surface 22 where the laser scribed grooves 12 are formed may be a rear side of the substrate or a top side of the semiconductor multilayer film.

One of the features of this example is the cross-sectional shape of this laser scribed groove 12. More specifically, the laser scribed groove 12 has a small depth at a first bar side face 18 of the bar 10, and is laser scribed to vary its depth nearly linearly so that the depth increases as the distance from the first bar side face 18 increases.

After selectively forming such laser scribed grooves 12 at positions intended for separation, load 24 indicated by an arrow is applied to a second major surface 20 side of the laminated body 80, which is on the side opposite to the laser scribed groove 12. To apply the load 24, it is preferable to use a "needle" having a blade-like or needle-like tip with the aid of an automatic apparatus. While the load 24 may be applied to any position on a device boundary 60, it is more preferable to apply it near directly below (in FIG. 1) the laser scribed groove 12.

Figure 2:
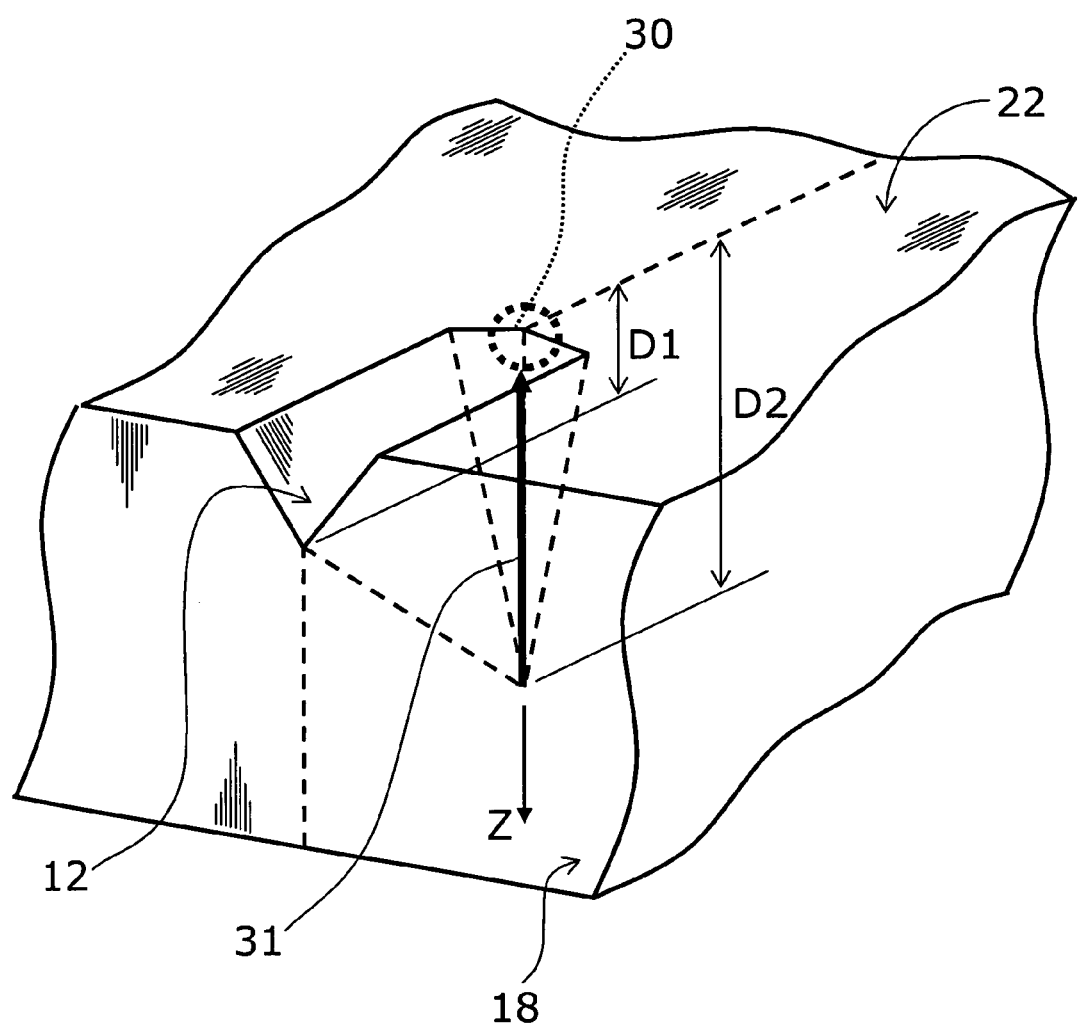
FIG. 2 is a partially enlarged perspective view of a laser scribed groove shown in FIG. 1.

FIG. 2 is a perspective view in which the vicinity of the laser scribed groove 12 is enlarged.

Figure 3:
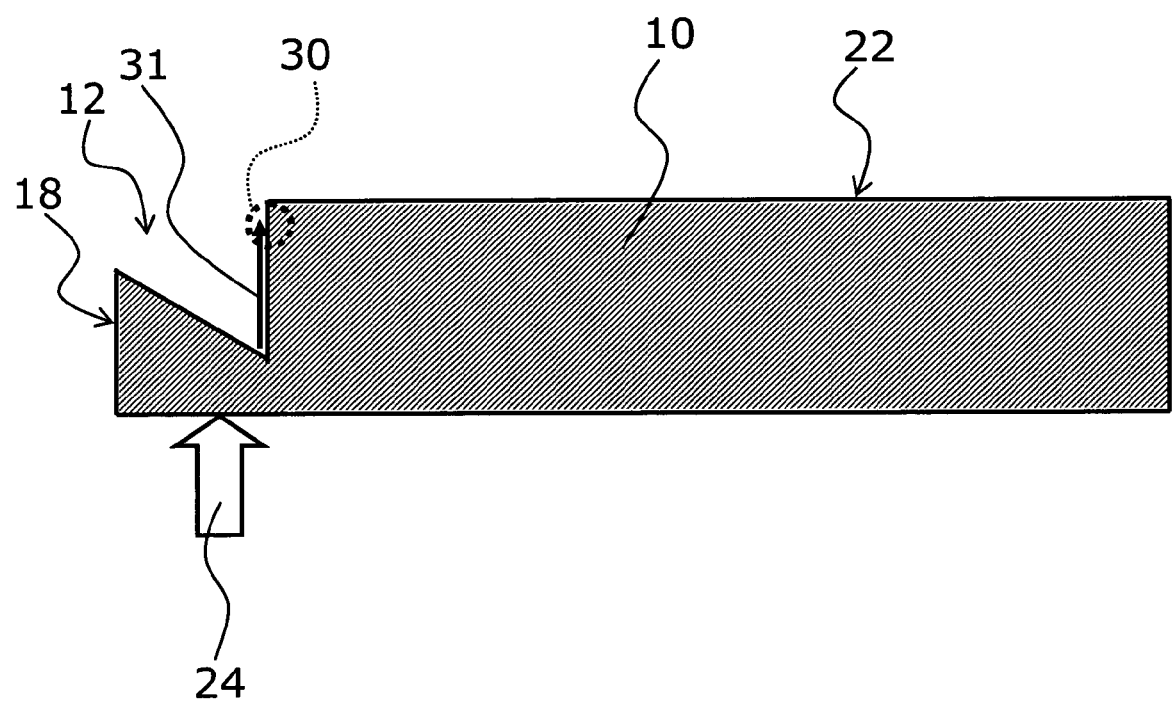
FIG. 3 is a schematic view showing a cleavage cross section of a semiconductor device obtained by forming a laser scribed groove and then applying load for separation.

FIG. 3 is a schematic view showing a cleavage cross section of a semiconductor device obtained by forming a laser scribed groove 12 and then applying load for separation.

The load 24 propagating toward the first major surface 22 is passed near the deepest portion of the laser scribed groove 12 and then directed along the stress propagation direction 31 indicated by an arrow. As a result, stress is maximized at a stress concentration portion 30 shown in FIGS. 2 and 3.

Starting at around this stress concentration portion 30, horizontal stress 62 acts along the surface of the first major surface 22 in the direction nearly orthogonal to the laser scribed groove 12 so that individual semiconductor devices can be separated. This separation process produces a device side face 14 and a laser scribed groove side face illustrated in FIG. 1.

Next, the function of the laser scribed groove 12 as mentioned above is described by way of stress simulation.

Figure 4:
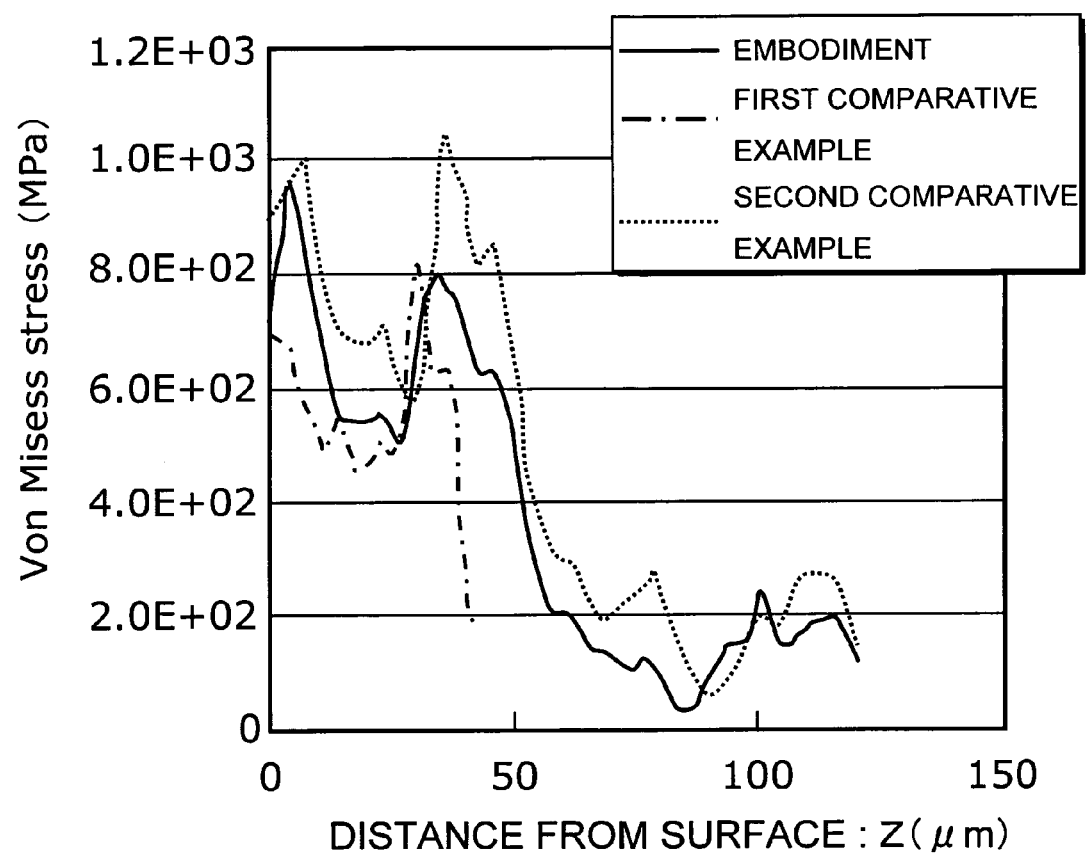
FIG. 4 is a graphical diagram showing the relation between the depth distance and the equivalent stress.

FIG. 4 is a graphical diagram showing the result of analyzing the vertical component of equivalent stress (in MPa) as a function of the depth distance from the first major surface 22 by way of stress simulation and the like. A solid line indicates this example. In this example, the bar 10 has a thickness of 140 micrometers, and the laser scribed groove (V-shaped) has a depth D1 of 20 micrometers at its shallow portion on the first bar side face 18 and a depth D2 of 120 micrometers at its deepest portion, with the depth being varied nearly linearly. The Z axis is taken along the scribe line boundary perpendicular to the first major surface 22 as illustrated in FIG. 2 and is used for measuring the depth distance (μm).

In this example indicated by the solid line, an equivalent stress of about 950 MPa is concentrated near the surface at a distance of several micrometers away from the first major surface 22. While there is a subpeak of about 800 MPa at a depth of about 35 micrometers from the surface, it is smaller than the 950 MPa equivalent stress near the surface. Therefore device separation is able to occur near the surface. This is because a stress concentration portion 30 is successfully placed near the tip boundary of the laser scribed groove 12 by making the laser scribed groove 12 shallower near the surface at the first bar side face 18 than in the internal region so that the stress is likely to propagate along the Z axis.

Next, a comparative example is described.

Figure 5:
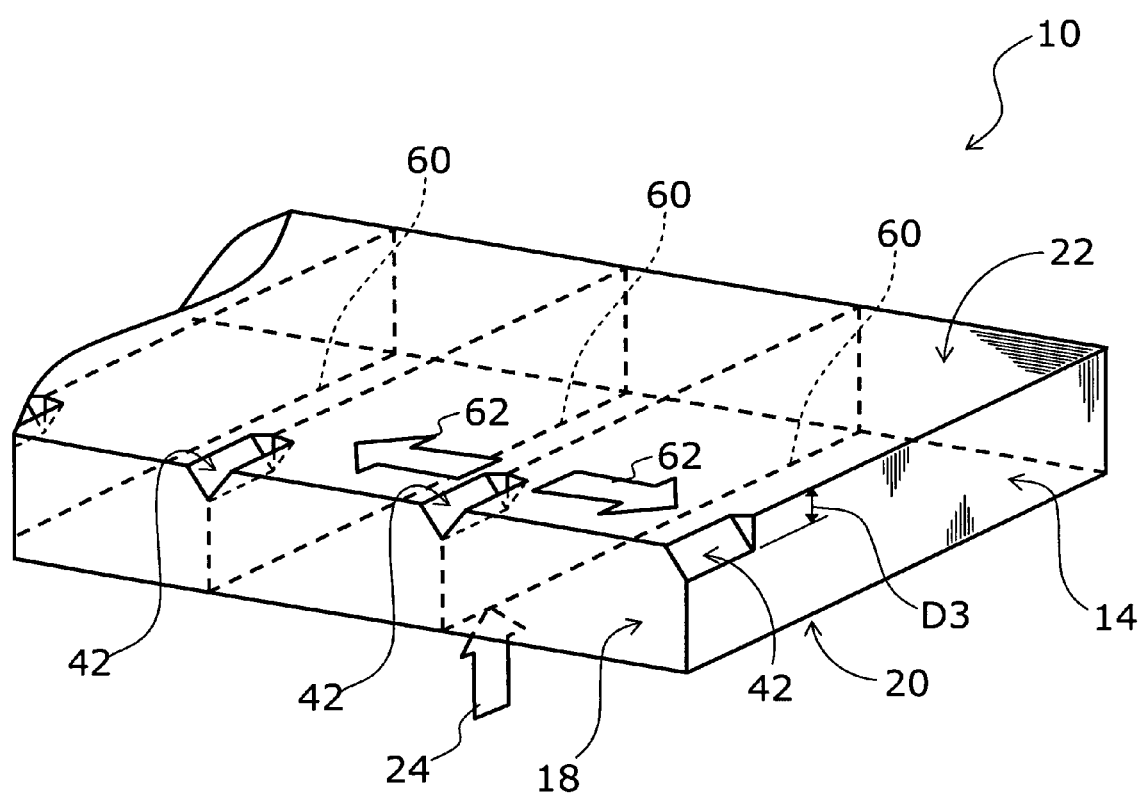
FIG. 5 is a schematic perspective view illustrating the relevant part of a method of manufacturing a nitride semiconductor device according to a comparative example.

FIG. 4 illustrates a first comparative example by dash-dotted line and a second comparative example is illustrated by dashed line. In the first comparative example as illustrated in the schematic perspective view of FIG. 5, the laser scribed groove 42 has a uniform depth D3 of 40 micrometers. In the second comparative example, the laser scribed groove 12 has a uniform depth D3 of 120 micrometers.

In the first comparative example, the equivalent stress has a maximum of about 800 MPa at a depth of about 30 micrometers, and there is a lower subpeak of about 700 MPa near the surface. As a result, the starting point of separation primarily occurs at the inside where the equivalent stress is maximized. If the starting point of separation occurs inside at about 30 micrometers from the surface as described above, the stress is likely to disperse and may cause cracks on the separation surface.

Similarly, in the second comparative example, a maximum stress of 1030 MPa occurs at a depth of about 37 micrometers, and there is a subpeak of about 1000 MPa at a distance of about 7 micrometers from the surface. In this case, the starting point of separation may occur either near the surface or inside at a distance of about 37 micrometers. If the starting point of separation occurs inside, the stress is likely to disperse and may cause cracks on the separation surface like the first comparative example.

In particular, since substrate material of hexagonal crystal such as GaN, sapphire, and SiC is rigid, it may be separated obliquely relative to the depth direction or the separated surface may be roughened to cause cracks, depending on the shape of the scribed groove and the manner of applying load.

Figure 6:
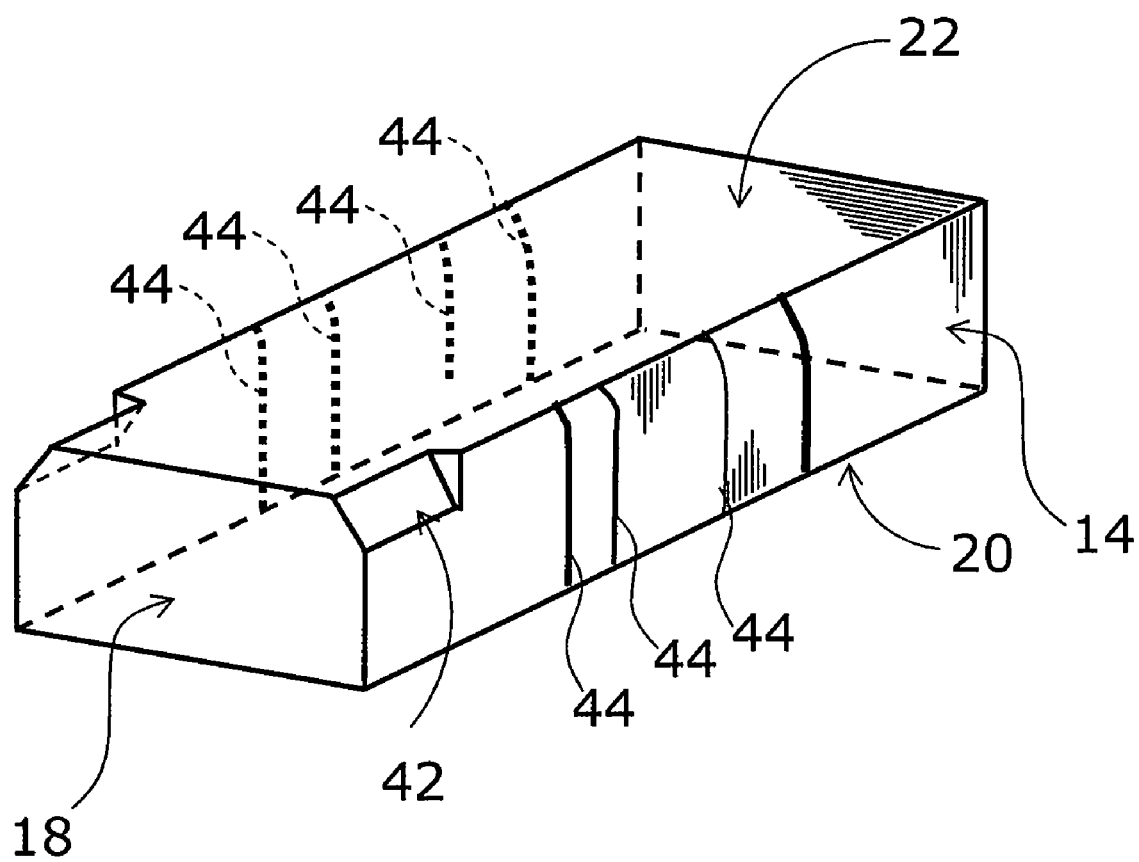
FIG. 6 is a schematic perspective view showing cracks generated on the side face in the comparative example.

FIG. 6 is a schematic perspective view showing cracks generated on the side face of a semiconductor device.

Cracks 44 occur irregularly on the device side face 14. Such cracks 44 may impose mechanical strain on the semiconductor device and thereby influence its electrical and optical characteristics. Moreover, since the cracks 44 decrease mechanical strength, they adversely affect the assembly process. Furthermore, the cracks 44 are undesirable in view of reliability. As described later, the cracks are undesirable when a resonant plane of a semiconductor laser device is formed by separation.

Figure 7:
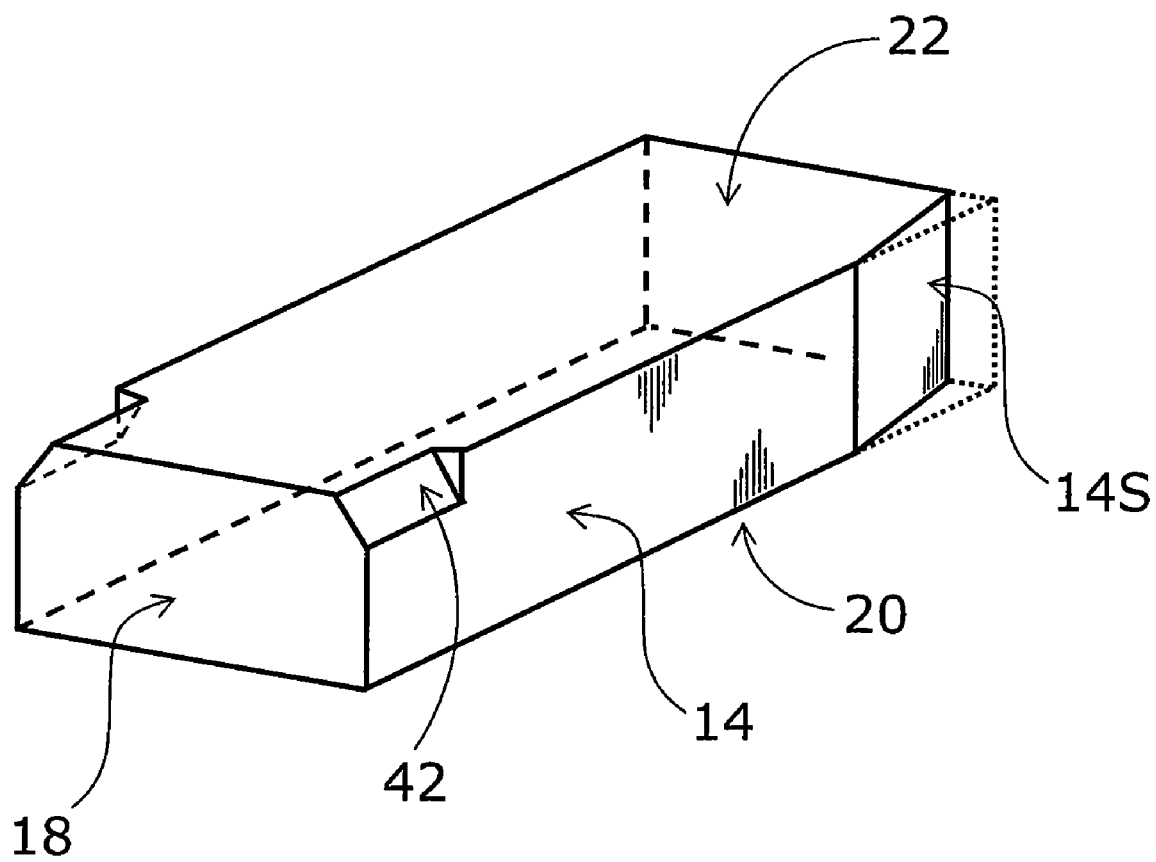
FIG. 7 is a schematic perspective view showing "chipping" in an oblique direction in the comparative example.

FIG. 7 is a schematic perspective view showing a device that is obliquely chipped because the scribed groove has an inappropriate shape.

When the laser scribed groove 42 has an inappropriate shape, part of the device side face 14 may be obliquely chipped like this to form an oblique side face 14S. Such an oblique side face 14S deforms the shape of the laser chip, which has adverse effects such as variation of light emission and heat dissipation characteristics and failure to mount the chip at an appropriate position.

Next, a laser scribing process is described in more detail.

Since GaN substrate is a hexagonal crystal, its surface is either an N (nitrogen) surface or a Ga (gallium) surface. The laser scribed groove 12 has different surrounding conditions for the N surface and for the Ga surface.

Figure 8:
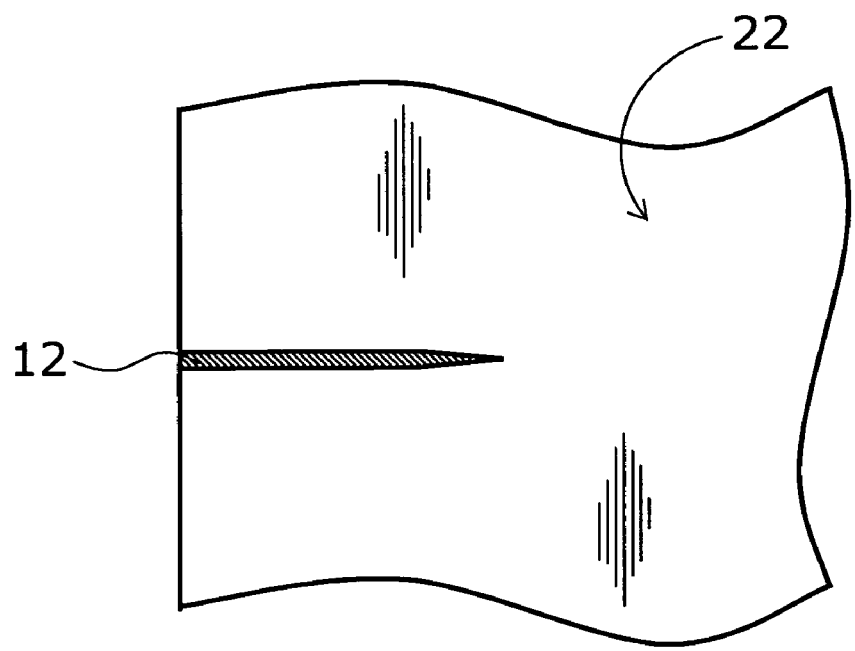
FIG. 8 is a schematic plan view showing an N surface after laser scribing in the present example.

FIG. 8 is a schematic plan view of a laser scribed groove 12 formed on an N surface by laser irradiation.

Here the first major surface 22 is an N surface. When the N surface side is irradiated with laser, no "swarf" occurs near the laser scribed groove 12.

Figure 9:
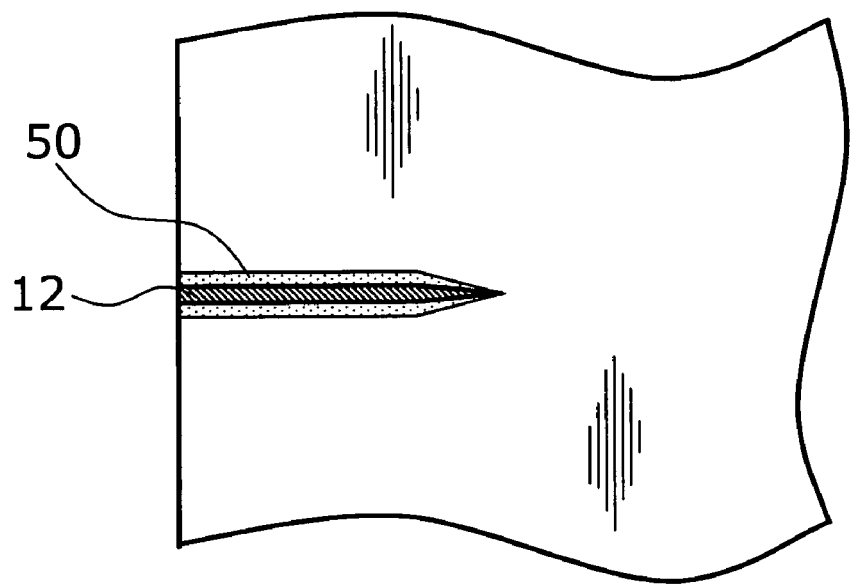
FIG. 9 is a schematic plan view showing "debris" generated on a Ga surface after laser scribing.

FIG. 9 is a schematic plan view of a laser scribed groove 12 formed on a Ga surface by laser irradiation.

When the Ga surface side is irradiated with laser, swarf known as "debris" may scatter around the laser scribed groove 12. For a semiconductor laser or other device, such debris is undesirable because the debris attached to the end face served for an optical resonator of the device may affect its FFP (Far Field Pattern).

Typically, on a GaN substrate, it is often the case that an InGaAlN-based multilayer film is crystal grown on a Ga surface. In this case, the rear side of the substrate, being not subjected to crystal growth of InGaAlN-based multilayer film, is an N surface. Therefore, preferably, the rear side of the substrate not subjected to crystal growth is used as the first major surface 22 to be irradiated with laser.

On the other hand, there is a crystal growth method of growing InGaAlN-based material laterally relative to the major surface of the substrate. This is also known as "lateral epitaxy". For example, on the surface of a single crystal substrate, a striped pattern of asperities or a striped mask (made of $SiO_2$ and the like) is formed, on which InGaAlN-based material is epitaxially grown. In this situation, epitaxial growth of the InGaAlN-based material is started at a predetermined portion (e.g., an opening of the mask) of the substrate and it is then epitaxially grown in the lateral direction relative to the major surface of the substrate (e.g., in the horizontal direction on the mask). On the surface of the InGaAlN epitaxial layer thus obtained, an N surface and a Ga surface may appear corresponding to the asperity pattern or mask pattern provided on the substrate. In this case, "debris" can be reduced by providing a laser scribed groove 12 in the N surface portion on the surface of the InGaAlN multilayer film.

Next, the condition of YAG laser irradiation for forming a laser scribed groove 12 is described.

The wavelength of YAG laser light is about 1050 nanometers. Therefore the third harmonic has a wavelength of about 350 nanometers. This is desirable because the optical absorptance of GaN substrate and sapphire is large and the laser light is likely to be absorbed into the substrate.

An optical system equipped with a collimating lens and the like is used to focus YAG laser light into a beam having a diameter of about 10 micrometers, for example, on the first major surface 22. A V-groove shape is achieved by setting the laser power to 0.6 watt, for example. The first major surface 22 of the laminated body 80 of a GaN substrate and a nitride semiconductor multilayer film can be scanned with this beam by a predetermined distance to form a laser scribed groove 12 illustrated in FIG. 1.

By scanning with such a beam optimally formed from laser light and irradiating the N surface with the laser, a high-quality cleavage plane without "debris" is reliably obtained and the reliability of the nitride semiconductor device is improved. Moreover, the device cross section has no "fracture", "chipping", "crack", and the like, facilitating mechanical registration and image recognition in the automatic assembly process. This results in facilitating automation in the separation process and improving productivity, which has many advantages in terms of price.

The length of the laser scribed groove 12 can be set to, for example, 50 to 200 micrometers depending on the device size. The depth of the laser scribed groove 12 can be set to, for example, 10 to 150 micrometers.

Next, variations of the laser scribed groove 12 formed in this embodiment are described.

Figure 10:
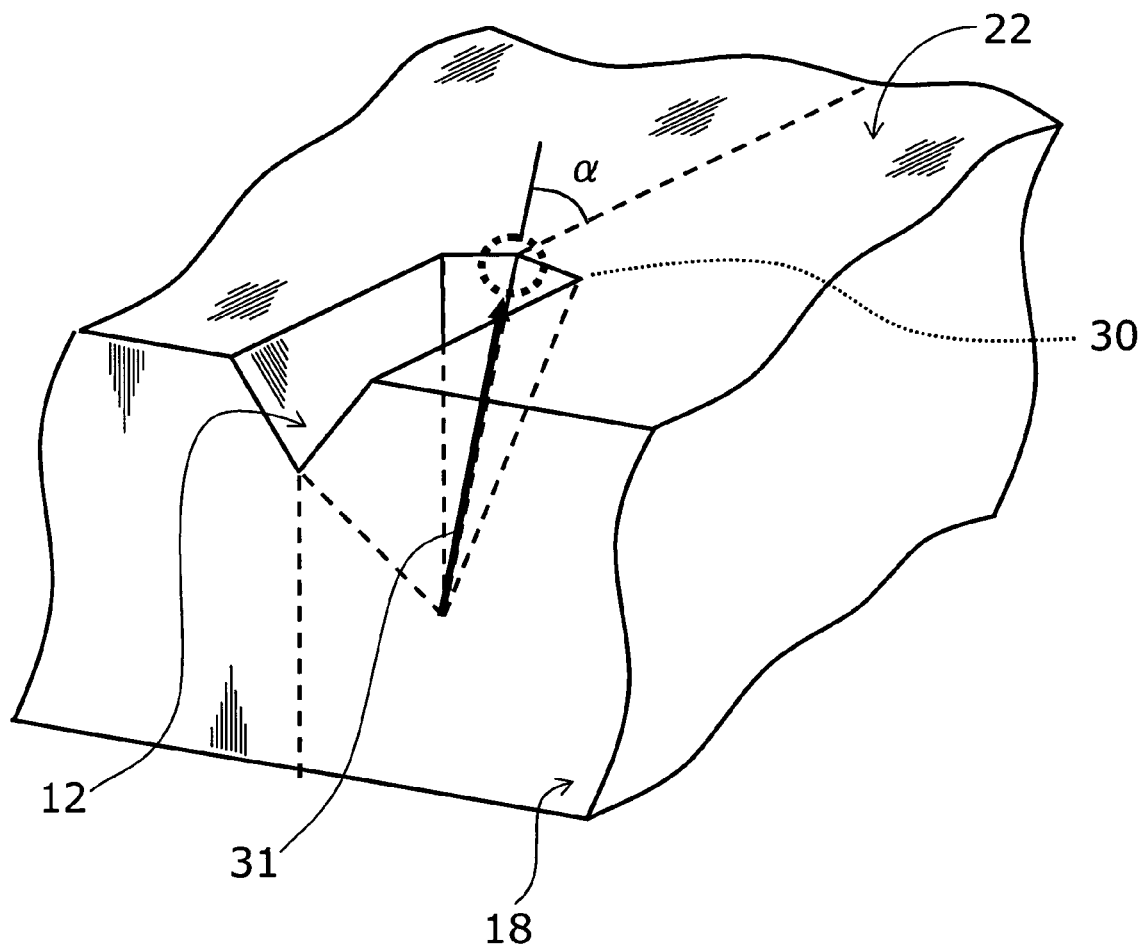
FIG. 10 is a schematic perspective view showing a first variation of the laser scribed groove.

FIG. 10 is a schematic perspective view showing a first variation of the laser scribed groove 12.

Figure 11:
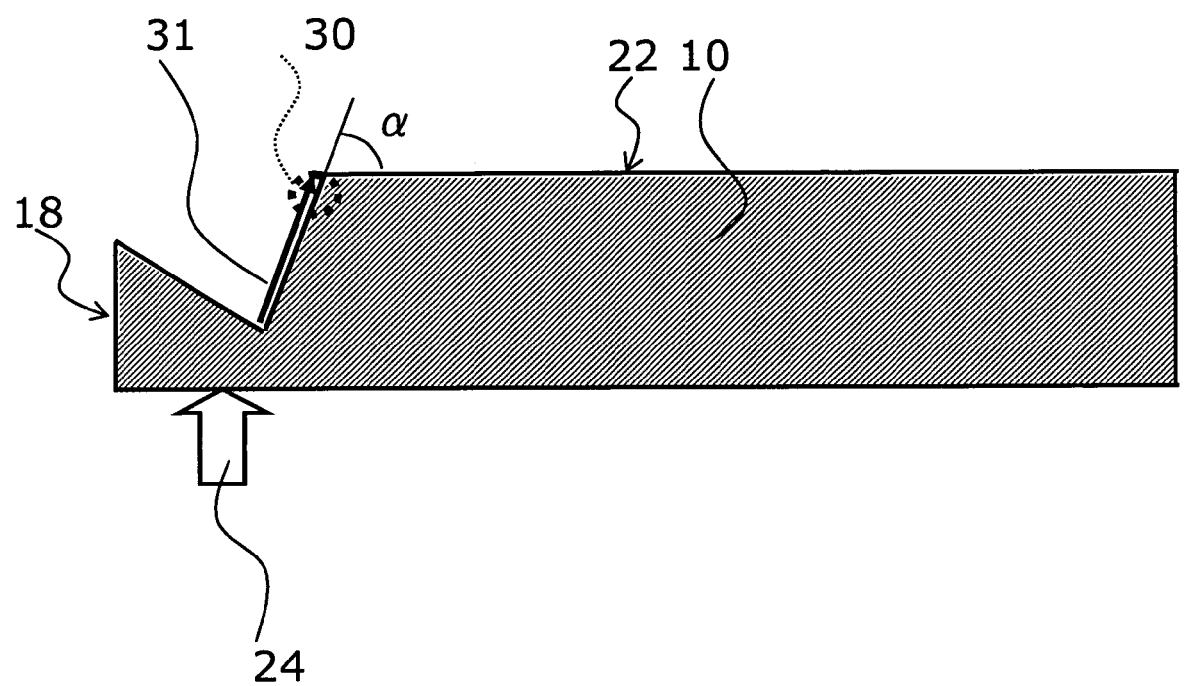
FIG. 11 is a schematic view showing a cleavage cross section of a semiconductor device obtained by forming a laser scribed groove and then applying load for separation.

FIG. 11 is a schematic view showing a cleavage cross section of a semiconductor device obtained by forming a laser scribed groove 12 of this variation and then applying load for separation.

In the example described above with reference to FIG. 2, the scribed groove boundary is nearly perpendicular to the first major surface 22 and nearly coincides with the Z axis. On the other hand, in the first variation, the scribed groove boundary is not perpendicular to the first major surface 22 but forms an angle $\alpha$ ($0 < \alpha < 90°$). This enables the flexibility of the pressure propagation direction 31 to be increased and facilitates stress concentration nearer to the surface. As a result, the starting point of separation can occur nearer to the surface and prevent cracks from occurring on the separation surface.

Figure 12:
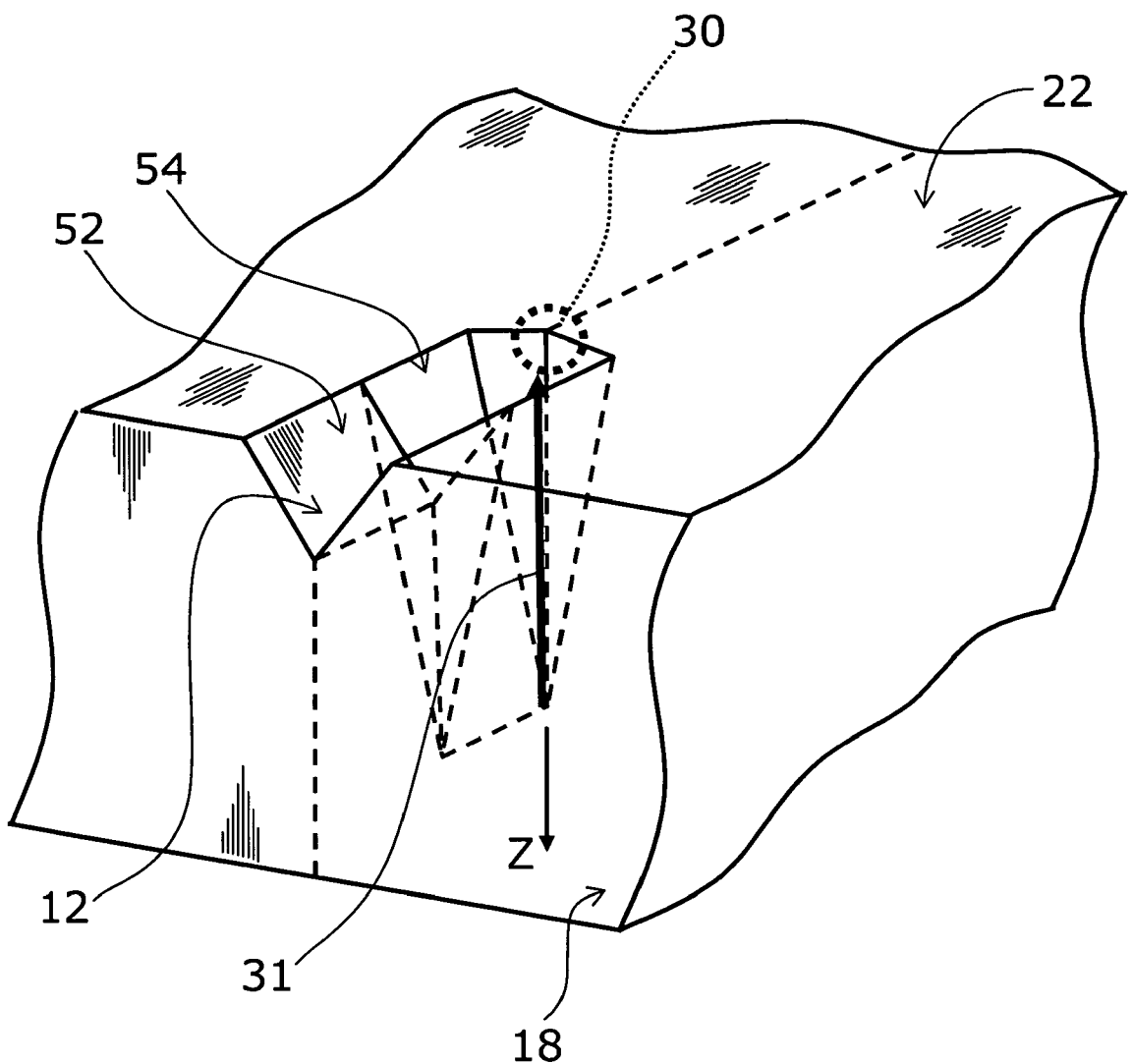
FIG. 12 is a schematic perspective view showing a second variation of the laser scribed groove.

FIG. 12 is a schematic perspective view showing a second variation of the laser scribed groove 12.

Figure 13:
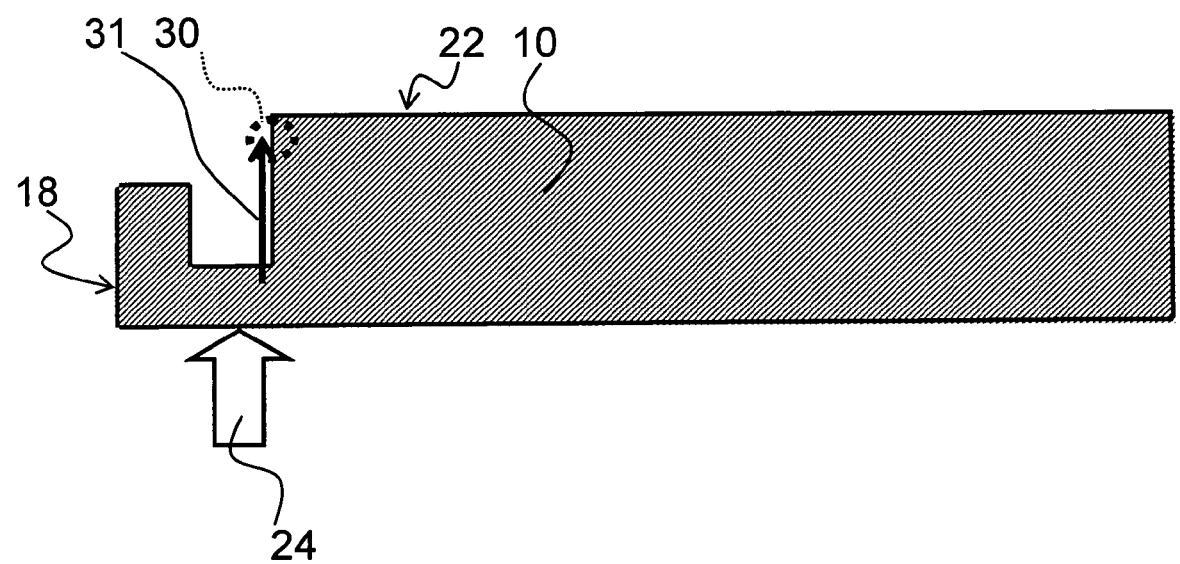
FIG. 13 is a schematic view showing a cleavage cross section of a semiconductor device obtained by forming a laser scribed groove and then applying load for separation.

FIG. 13 is a schematic view showing a cleavage cross section of a semiconductor device obtained by forming a laser scribed groove 12 of this variation and then applying load for separation.

In this variation as shown in FIG. 12, the laser scribed groove 12 is primarily composed of a first V-groove 52 and a second V-groove 54. In this configuration, the depth of the first V-groove 52 located on the surface side and the depth of the second V-groove 54 located in a more inside region can be independently varied, which can increase the flexibility of control over the peak value of the equivalent stress.

Figure 14:
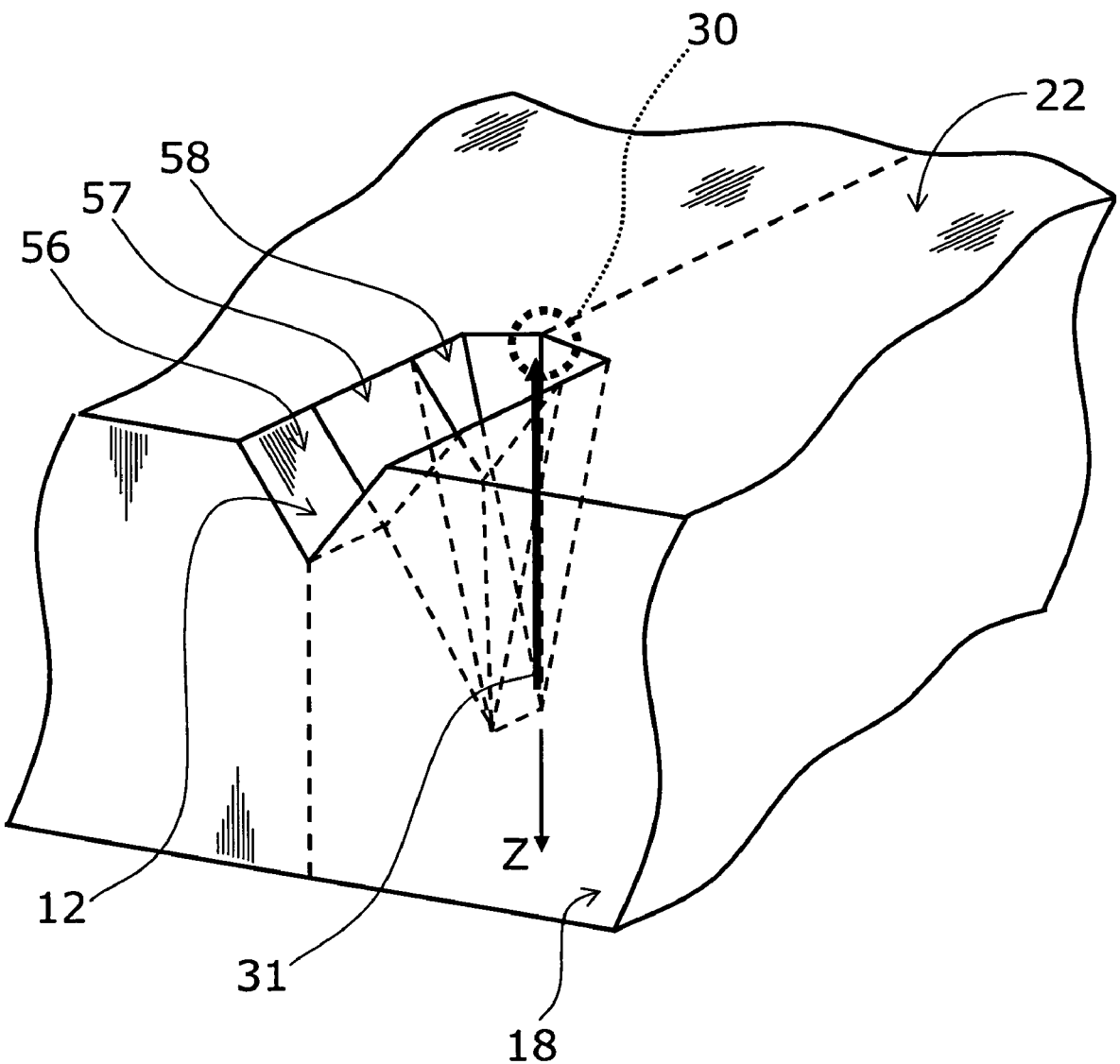
FIG. 14 is a schematic perspective view showing a third variation of the laser scribed groove.

FIG. 14 is a schematic perspective view showing a third variation of the laser scribed groove 12.

Figure 15:
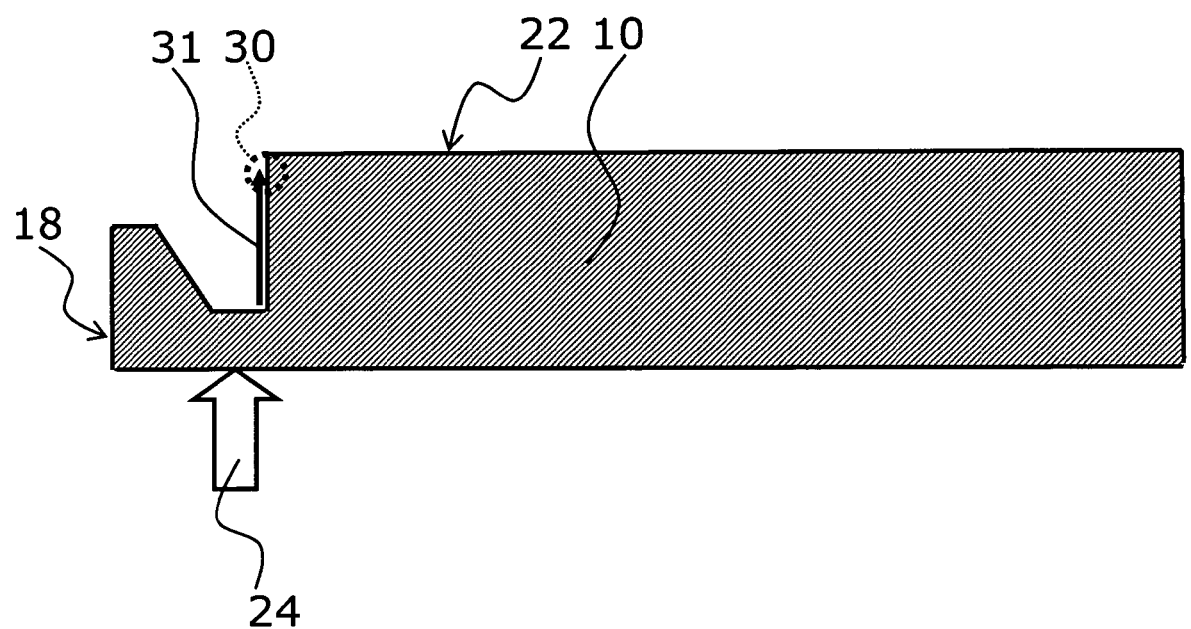
FIG. 15 is a schematic view showing a cleavage cross section of a semiconductor device obtained by forming a laser scribed groove and then applying load for separation.

FIG. 15 is a schematic view showing a cleavage cross section of a semiconductor device obtained by forming a laser scribed groove 12 of this variation and then applying load for separation.

In this variation as showing in FIG. 14, the laser scribed groove 12 is primarily composed of a third V-groove 56, an intermediate groove 57, and a fourth V-groove 58. The intermediate groove 57 is shaped so that the depth (in the Z direction) from the first major surface 22 increases nearly linearly as the distance from the first side face 18 increases, and functions generally in the same manner as the laser scribed groove 12 illustrated in FIG. 2. The depth in the Z direction of the third V-groove 56 is made shallower than the depth in the Z direction of the fourth V-groove 58. In this way, the intermediate groove 57 enables the flexibility of peak value control of the equivalent stress to be further increased as compared to the second variation.

The foregoing description refers to separation into individual devices, that is, "chip cleavage". The following description is directed to separation of the laminated body 80 including a semiconductor multilayer film into bars 10, that is, "bar cleavage".

In general, in very high frequency devices including FET (Field Effect Transistor), HEMT (High Electron Mobility Transistor), and HBT (Hetero Bipolar Transistor), and high power devices including FET and IGBT (Insulated Gate Bipolar Transistor), most pn junctions are not exposed on the separated side face of the device but are buried inside.

Therefore the condition of the separated side face of the device does not significantly affect its characteristics. For this reason, instead of cleavage, it is also possible to adopt a method of using a scriber or blade dicer of a diamond needle or the like to form a groove and then attaching the body to a sheet to be stretched for device separation. Naturally, a mechanical crush layer remains on the separated device side face.

However, for an LED (Light Emitting Diode) or semiconductor laser device of a nitride semiconductor, pn junctions are often exposed on the separated device side face. More specifically, in an LED or semiconductor laser device of a nitride semiconductor, it is necessary to form a multilayer film of semiconductor thin films with predetermined conductivity types and predetermined carrier concentrations under control. This is because it is difficult to produce an LED or semiconductor laser device using a manufacturing method of impurity diffusion or ion implantation to selectively form p-n junctions.

For this reason, in an LED or semiconductor laser device, pn junctions are often exposed on the device side face. In this situation, the characteristics of p-n junctions will be affected unless the separated device side face is "clean". It is therefore desirable to use cleavage to form the device side face.

In particular, in a semiconductor laser device, the first bar side face 18 typically serves as a reflecting plane of an optical resonator. For this reason, for example, the side face 18 is desirably a cleaved mirror surface. Moreover, laser light is emitted from an emission point located about several micrometers from the edge of the side face 18. Therefore no cracks and the like should exist near the emission point. Cracks would disturb the FFP (Far Field Pattern) of laser light and cause errors in detecting optical disk signals.

Next, a process of separating an epitaxially grown wafer into semiconductor devices is described.

Figure 16:
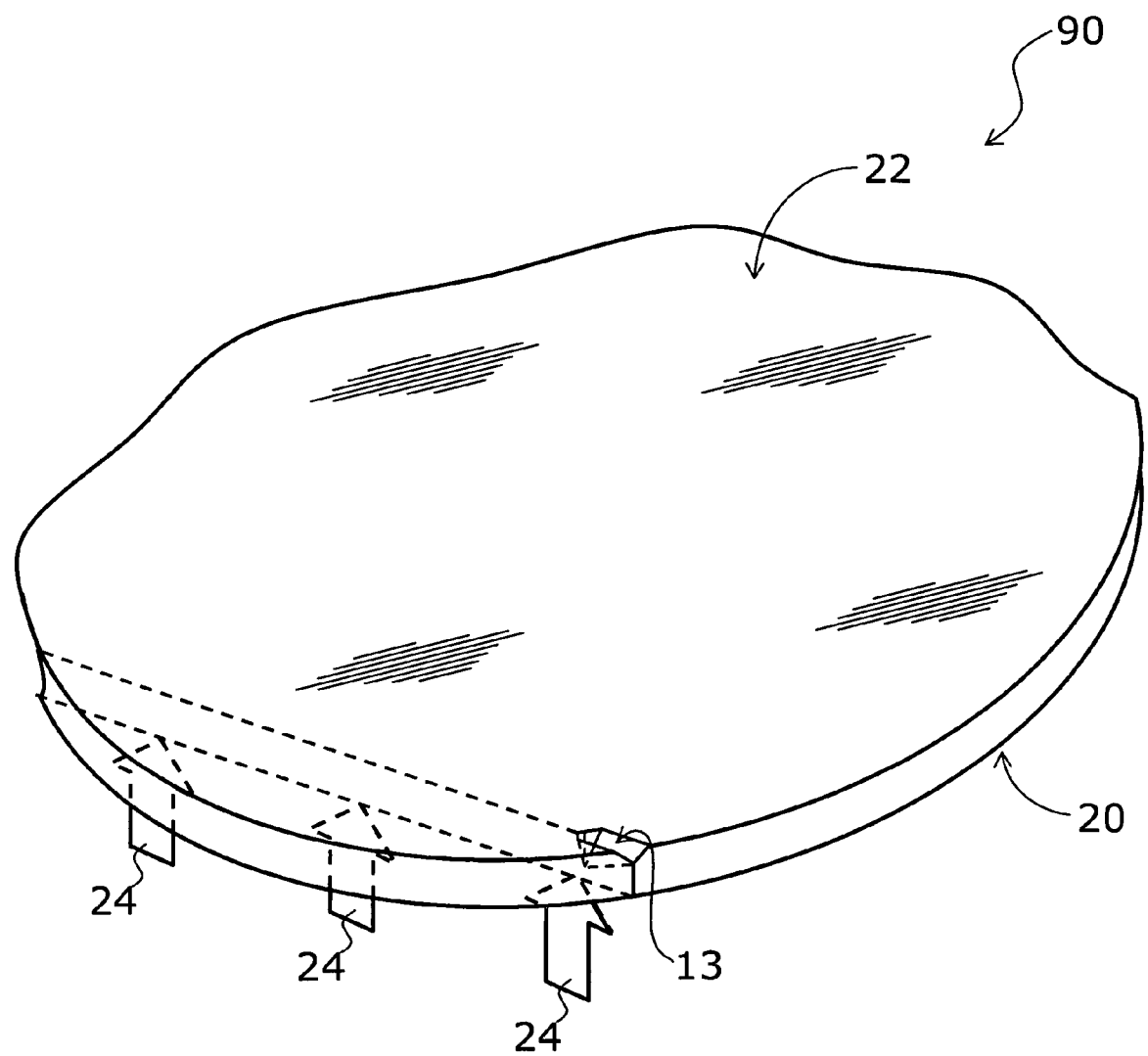
FIGS. 16 and 17 are schematic perspective views for illustrating a process of cutting the periphery of an epitaxially grown wafer to form a rectangular laminated body.
Figure 17:
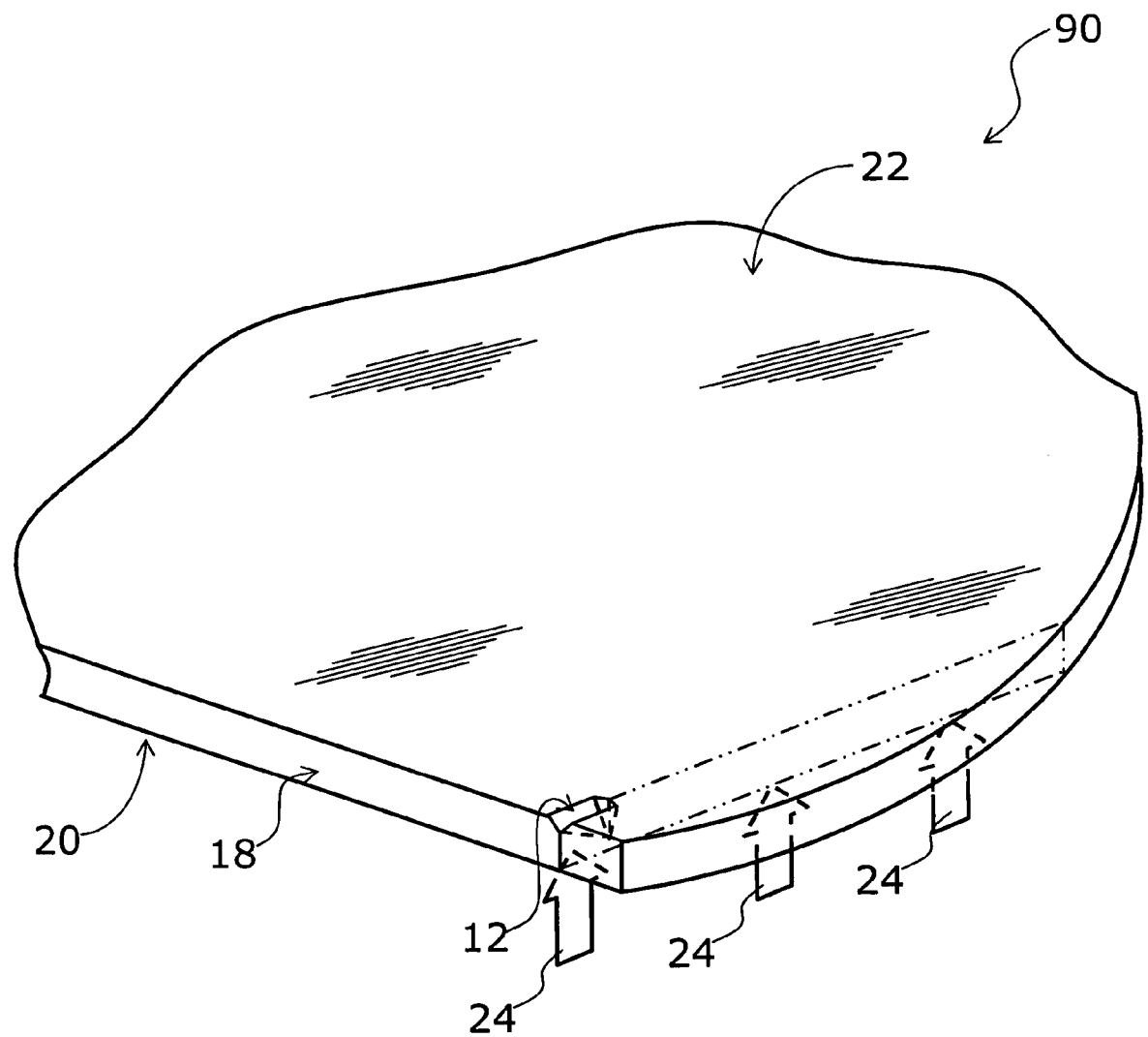

FIGS. 16 and 17 are schematic perspective views for illustrating a process of cutting the periphery of an epitaxially grown wafer to form a rectangular laminated body.

More specifically, the epitaxially grown wafer may have a generally circular shape, an indeterminate shape, or a generally rectangular shape, depending on the shape of the substrate being used. When such a substrate is separated into semiconductor devices such as semiconductor lasers, it is desirable to first separate the periphery of the wafer 90 to expose a cleavage plane, thereby forming a rectangular laminated body.

For example, in the process shown in FIG. 16, the epitaxially grown wafer 90 is irradiated with laser light at the edge of its major surface 22 to form a laser scribed groove 13. Load can then be applied to the rear side as indicated by arrows 24 to remove the periphery portion, thereby forming a first cleavage plane 18.

Next, as shown in FIG. 17, the wafer 90 is irradiated with laser light at the edge of its major surface 22 to form a laser scribed groove 12. Load can then be applied to the rear side as indicated by arrows 24 to form a second cleavage plane 14 that is generally orthogonal to the first cleavage plane 18. Similarly, the periphery portion of the wafer can be removed also at the other edges opposite to these cleavage planes 18 and 14 to form other cleavage planes.

In this way, a laminated body 80 surrounded by the cleavage planes 14 and 18 having a predetermined crystal orientation can be cut from the wafer 90.

Next, this laminated body 80 is cleaved to separate bars.

Figure 18:
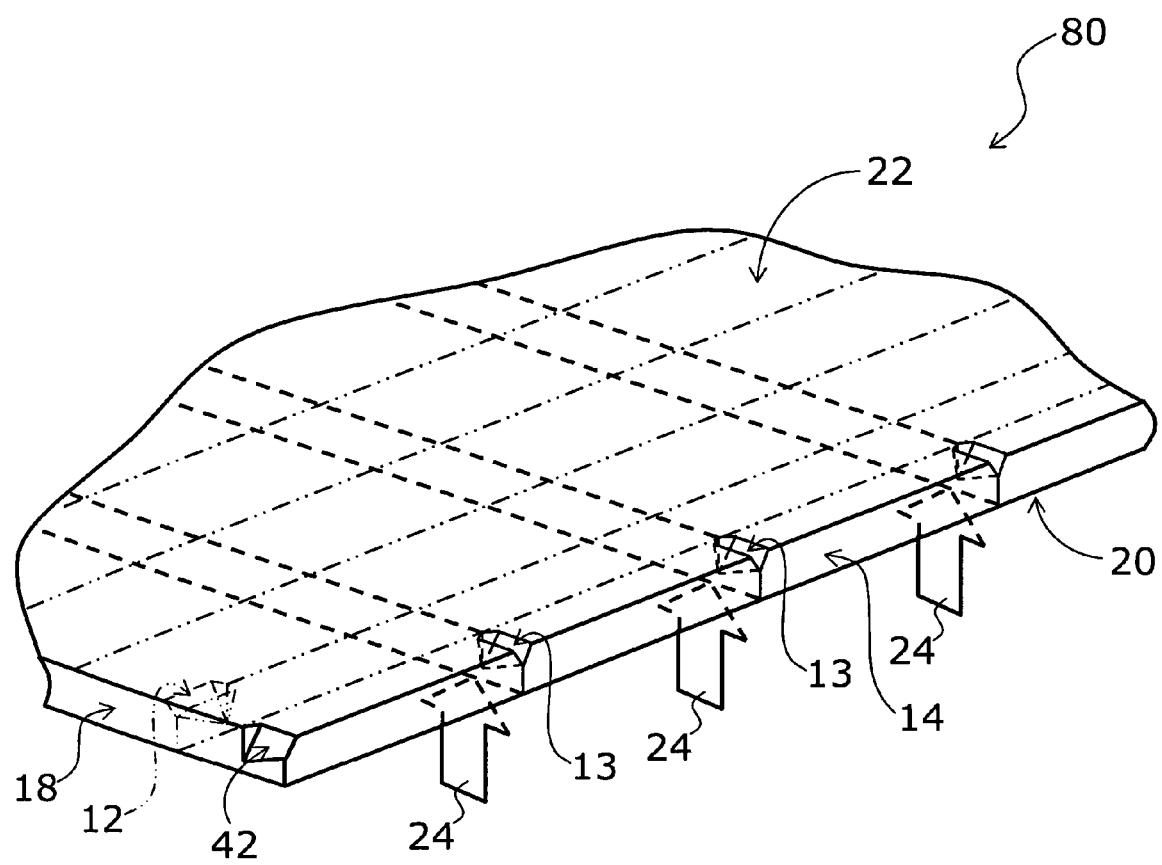
FIGS. 18 and 19 are schematic perspective views illustrating the relevant part of a process of separating a laminated body of a semiconductor multilayer film and a substrate into bars according to the present example.

FIG. 18 is a schematic perspective view illustrating a process of cleaving the laminated body 80 into a plurality of bars.

Laser scribed grooves (for bar cleavage) 13 are formed on the first major surface 22 of the laminated body 80, for example, on an N surface of the GaN substrate, at the device side face 14. The laser scribed groove 13 can be shaped as described above with reference to FIGS. 1 to 15. Load 24 is then successively applied to the second major surface 20 being opposite to the first major surface 22 to obtain bars 10 successively. The corner of the first bar side face 18 becomes a laser scribed groove side face 42. The foregoing is a first separation process corresponding to "bar cleavage".

The first bar side face 18 thus obtained is desirable as an end face constituting a resonator in a semiconductor laser device because it is a cleaved mirror surface. Subsequently, a second separation process, that is, a "chip cleavage" process for separation into individual devices described above with reference to FIGS. 1 to 15, is performed. More specifically, as illustrated in FIG. 18, for each bar 10, a laser scribed groove 12 can be successively formed and load can be applied to separate semiconductor devices.

Such a "bar cleavage" process is not limited to LEDs and semiconductor laser devices, but can be widely used for a method of manufacturing semiconductor devices.

It should be noted that in FIG. 18, the semiconductor multilayer film constituting the laminated body 80 is formed on the second major surface 20 that is a Ga surface of GaN substrate, and the laser scribed groove 12 for "chip cleavage" is also formed on the first major surface.

Figure 19:
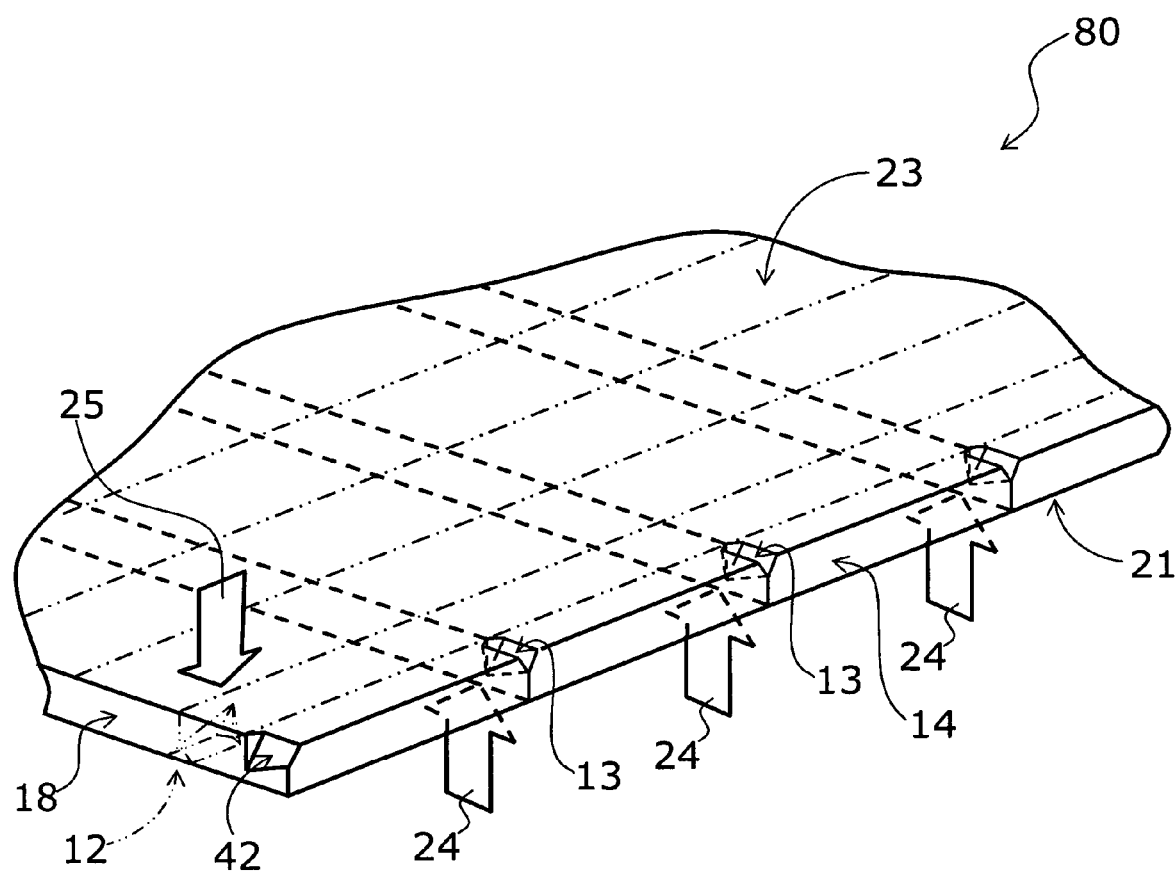

FIG. 19 is a perspective view for illustrating the case where an InGaAlN multilayer film is formed by lateral epitaxy.

In the first separation process, laser scribed grooves (for bar cleavage) 13 are formed on a first major surface 23. That is, the laser scribed grooves 13 are formed on the surface opposite to the surface subjected to epitaxial growth.

On the other hand, since the surface on the stripe core of the epitaxial layer can be an N surface, laser scribed grooves 12 can be provided on the surface of the stripe core. For this reason, in the second separation process, the laser scribed grooves 12 are formed on a second major surface 21 on which a semiconductor multilayer film is formed, opposite to the first separation process, and load 25 is applied to the first major surface 23. In this way, a manufacturing method capable of achieving a high-quality device side face with high productivity is also provided for a laminated body 80 including a lateral epitaxial multilayer film.

Figure 20:
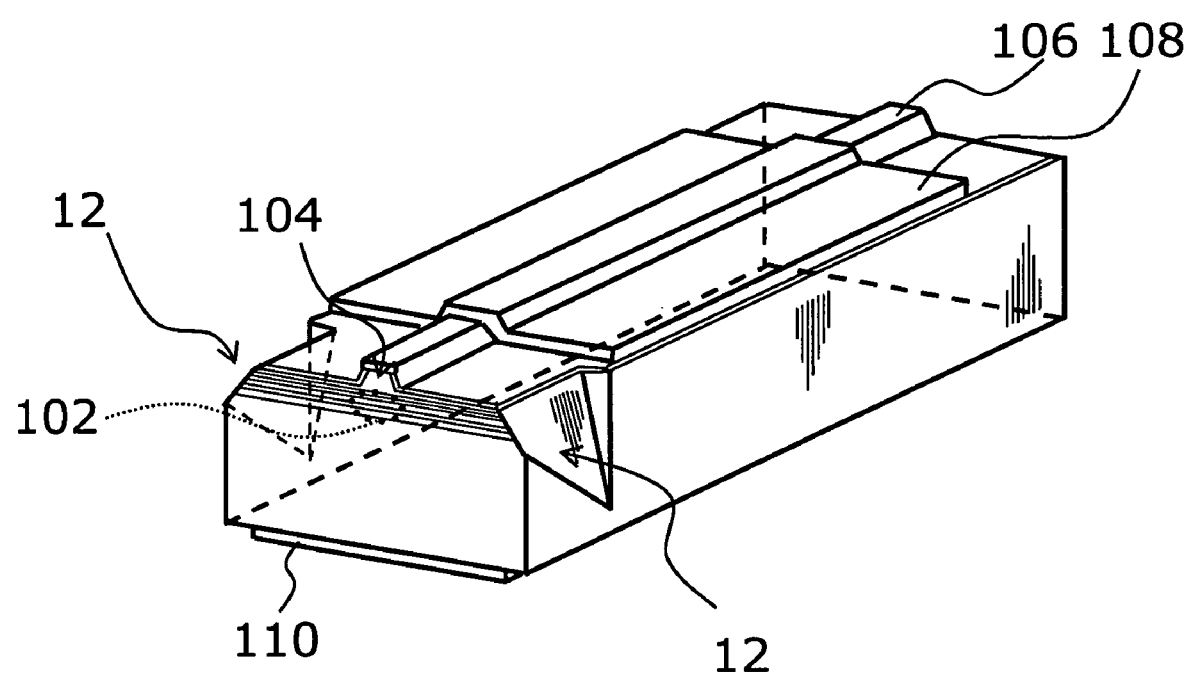
FIG. 20 is a schematic perspective view showing a semiconductor laser device according to the example of the invention.

FIG. 20 is a schematic perspective view showing a semiconductor laser device according to the example of the invention. A bar cleavage surface of the semiconductor multilayer film which is formed on the GaN substrate is a light emitting portion 102. A p-side electrode is formed on an upper portion of the ridge wave guide 104 for controlling a lateral transverse mode of a laser beam, and a pad electrode 108 is formed on the p-side electrode 106. An n-side electrode 110 is formed on another surface facing a major surface on which the p-side electrode 106 is formed. The laser scribed grooves 12 can be provided on a surface perpendicular to the bar cleavage surface.

The foregoing examples are primarily described with reference to the nitride semiconductor device. However, the invention is not limited thereto, and compound semiconductors other than a nitride semiconductor may be used for the compound semiconductor device of the present invention.

Furthermore, the foregoing examples are primarily described with reference to the substrate of GaN. However, the invention is not limited thereto, and the laminated body may be a sapphire substrate or SiC having a semiconductor multilayer film thereon.

According to an embodiment of the invention, there is provided a compound semiconductor device comprising: a laminated body having a substrate and a compound semiconductor multilayer film provided on a major surface of the substrate, at least one of the side faces of the laminated body having a scribed groove extending from an edge of the side face, and a depth viewed from a major surface of the laminated body being shallow in proximity to the edge and being deep at a distance from the edge.

The side face having the scribed groove may be a cleavage plane.

A side face of the laminated body that is generally orthogonal to the side face having the scribed groove may include an end face for emitting laser light.

Embodiments of the invention have been described with reference to examples. However, the invention is not limited to these examples.

Any shape, size, material, and arrangement of elements including semiconductor multilayer film and the substrate constituting the compound semiconductor device, and the shape of the scribed groove, the condition of applying load, and the condition of YAG laser irradiation that are variously adapted by those skilled in the art are also encompassed within the scope of the invention as long as they include the features of the invention.

Note that the "nitride semiconductor" used herein includes semiconductors having any composition represented by the chemical formula $In_xAl_yGa_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, the "nitride semiconductor" also includes those further containing any of various impurities added for controlling conductivity types.

The invention claimed is:

1. A method of manufacturing a compound semiconductor device comprising forming a scribed groove extending from an edge of one of first and second major surfaces of a laminated body to an internal region of the one of the first and second major surfaces, the groove extending in an extending direction from the edge toward an opposite edge of the one of the first and second major surfaces, the laminated body being formed by crystal growth of a compound semiconductor multilayer film on a substrate, and a depth of the scribed groove from the one of the first and second major surfaces being smaller at the edge in the extending direction and greater at the internal region in the extending direction.

2. The method of manufacturing the compound semiconductor device according to claim 1, wherein the scribed groove is formed by irradiating with laser light.

3. The method of manufacturing the compound semiconductor device according to claim 1, wherein the substrate is one of GaN, SiC, and sapphire.

4. The method of manufacturing the compound semiconductor device according to claim 1, wherein the substrate is GaN, and a portion of the one of the first and second major surfaces on which the scribed groove is formed is an N surface.

5. A method of manufacturing a compound semiconductor device comprising:
   forming a scribed groove extending from an edge of a first major surface of a laminated body to an internal region of the first major surface, the groove extending in an extending direction from the edge toward an opposite edge of the first major surface, the laminated body having the first major surface and a second major surface and being formed by crystal growth of a compound semiconductor multilayer film on a substrate, and a depth of the scribed groove from the first major surface being smaller at the edge in the extending direction and greater at the internal region in the extending direction; and
   separating the laminated body into first and second portions separated by a separation plane including the scribed groove by applying a load to the second major surface of the laminated body.

6. The method of manufacturing the compound semiconductor device according to claim 5, wherein the scribed groove is formed by irradiating with laser light.

7. The method of manufacturing the compound semiconductor device according to claim 5, wherein the substrate is one of GaN, SiC, and sapphire.

8. The method of manufacturing the compound semiconductor device according to claim 5, wherein the substrate is GaN, and a portion of the first major surface on which the scribed groove is formed is an N surface.

9. The method of manufacturing the compound semiconductor device according to claim 5, wherein the scribed groove has a depth varying substantially linearly from the edge to the internal region.

10. The method of manufacturing the compound semiconductor device according to claim 5, wherein the scribed groove has a depth varying stepwise from the edge to the internal region.

11. The method of manufacturing the compound semiconductor device according to claim 5, wherein the scribed grove has a depth varying substantially linearly from edge to the internal region, and a scribed groove boundary forms an angle greater than 0 and less than 90 degrees to the first major surface.

12. A method of manufacturing a compound semiconductor device comprising:
    forming a first scribed groove extending from an edge of a first major surface of a laminated body to an internal region of the first major surface, the groove extending in an extending direction from the edge toward an opposite edge of the first major surface, the laminated body having the first major surface and a second major surface and being formed by crystal growth of a compound semiconductor multilayer film on a substrate, a depth of the first scribed groove from the first major surface being smaller at the edge in the extending direction and greater at the internal region in the extending direction;
    forming a bar separated by a first separation plane including the first scribed groove by applying load to the second major surface of the laminated body;

forming a second scribed groove extending from an edge of one of the first and second major surfaces of the bar in an extending direction to an internal region, a depth of the second scribed groove from the one of the first and second major surfaces being smaller at the edge in the extending direction and greater at the internal region in the extending direction; and forming a semiconductor device separated by a second separation plane including the second scribed groove by applying load to the other of the first and second major surfaces of the bar.

13. The method of manufacturing the compound semiconductor device according to claim 12, wherein at least one of the first and second scribed grooves is formed by irradiating with laser light.

14. The method of manufacturing the compound semiconductor device according to claim 12, wherein the multilayer film is grown by lateral epitaxial growth.

15. The method of manufacturing the compound semiconductor device according to claim 12, wherein the second scribed groove has a depth varying substantially linearly from the edge to the internal region.

16. The method of manufacturing the compound semiconductor device according to claim 12, wherein the second scribed groove has a depth varying stepwise from the edge to the internal region.

17. The method of manufacturing the compound semiconductor device according to claim 12, wherein the second scribed groove has a depth varying substantially linearly from the edge to the internal region, and a scribed groove boundary forms an angle greater than 0 and less than 90 degrees to the first major surface.

18. The method of manufacturing the compound semiconductor device according to claim 12, wherein the substrate is GaN, and portions on which the first and second scribed grooves are formed are N surfaces.

19. The method of manufacturing the compound semiconductor device according to claim 12, wherein the multilayer film includes a light emitting layer.

20. The method of manufacturing the compound semiconductor device according to claim 12, wherein the first separation plane includes an end face for emitting laser light.

* * * * *